(12) United States Patent
Volkov (10) Patent No.: US 11,502,440 B2
(45) Date of Patent: Nov. 15, 2022

(54) MULTIPORT CONNECTOR INTERFACE SYSTEM

(71) Applicant: Carlisle Interconnect Technologies, Inc., St. Augustine, FL (US)

(72) Inventor: Peter Volkov, Torrance, CA (US)

(73) Assignee: Carlisle Interconnect Technologies, Inc., St. Augustine, FL (US)

( * ) Notice: Subject to any disclaimer, the term of this patent is extended or adjusted under 35 U.S.C. 154(b) by 0 days.

(21) Appl. No.: 17/078,684

(22) Filed: Oct. 23, 2020

(65) Prior Publication Data
US 2022/0131301 A1  Apr. 28, 2022

(51) Int. Cl.
*H01R 13/24* (2006.01)
*H01R 12/71* (2011.01)

(52) U.S. Cl.
CPC ....... *H01R 13/2421* (2013.01); *H01R 12/712* (2013.01)

(58) Field of Classification Search
CPC .......................... H01R 13/2421; H01R 12/712
See application file for complete search history.

(56) References Cited

U.S. PATENT DOCUMENTS

| | | | | |
|---|---|---|---|---|
| 1,347,738 A | * | 7/1920 | Douglas | ................. H01R 33/46 439/701 |
| 3,275,970 A | | 9/1966 | Bengt et al. | |
| 3,416,125 A | | 12/1968 | Theve | |
| 4,508,405 A | * | 4/1985 | Damon | ................ H05K 7/1069 324/754.08 |
| 4,740,746 A | | 4/1988 | Pollock et al. | |
| 4,789,351 A | | 12/1988 | Fisher, Jr. | |
| 5,076,794 A | * | 12/1991 | Ganthier | .............. H01R 12/714 439/70 |
| 5,329,262 A | | 7/1994 | Fisher, Jr. | |
| 5,727,954 A | * | 3/1998 | Kato | .................. H01R 13/2421 439/66 |

(Continued)

FOREIGN PATENT DOCUMENTS

| | | |
|---|---|---|
| FR | 2462797 A1 | 2/1981 |
| KR | 102122687 B1 | 6/2020 |

OTHER PUBLICATIONS

European Patent Office; Serach Report and Written Opinion in related International Patent Application No. PCT/US2021/052874 dated Jan. 19, 2022; 15 pages.

*Primary Examiner* — Neil Abrams
(74) *Attorney, Agent, or Firm* — Wood Herron & Evans LLP (57) ABSTRACT

A connector for interfacing with a circuit board includes a body having opposing first and second face surfaces and defining a plurality of ports extending between the face surfaces. A plurality of center conductors extend in respective ports between the face surfaces. Support elements engage the center conductors to secure the center conductors generally centered in the respective ports. Each center conductor includes a pin portion positioned proximate to the first face surface and a plunger portion positioned to extend beyond the second face surface. The plunger portion moves longitudinally with respect to the connector second face surface for varying the distance of an end of the center conductor from the second face surface to allow adjustability in the interfacing of the connector with a circuit board or other signal handling component.

14 Claims, 5 Drawing Sheets

(56) References Cited

U.S. PATENT DOCUMENTS

| | | | |
|---|---|---|---|
| 5,746,619 A | 5/1998 | Harting | |
| 6,053,777 A | 4/2000 | Boyle | |
| 6,247,939 B1* | 6/2001 | Bestul | H01R 13/2421 439/66 |
| 6,464,511 B1* | 10/2002 | Watanabe | G01R 1/06722 439/66 |
| 6,776,668 B1 | 8/2004 | Scyoc et al. | |
| 6,844,749 B2* | 1/2005 | Sinclair | G01R 1/0466 324/755.05 |
| 7,077,697 B2 | 7/2006 | Kooiman | |
| 7,416,418 B2 | 8/2008 | Berthet et al. | |
| 7,484,998 B2* | 2/2009 | Benham | H01R 9/0515 439/579 |
| 7,922,529 B1 | 4/2011 | Meurer | |
| 7,950,927 B2* | 5/2011 | Kazama | G01R 1/0483 439/66 |
| 7,972,173 B1 | 7/2011 | Hyzin et al. | |
| 8,360,805 B2* | 1/2013 | Schwarz | H01R 24/50 439/578 |
| 8,460,010 B2 | 6/2013 | Kimura | |
| 8,690,583 B2* | 4/2014 | Uesaka | H01R 12/714 439/63 |
| 8,888,527 B2 | 11/2014 | Chastain | |
| 8,926,342 B2* | 1/2015 | Vinther | H01R 13/65912 439/79 |
| 9,039,448 B2* | 5/2015 | Mason | H01R 13/658 439/607.09 |
| 9,059,545 B2* | 6/2015 | Mason | H01R 13/2421 |
| 9,689,897 B2* | 6/2017 | Rathburn | G01R 1/0466 |
| 10,006,939 B2* | 6/2018 | Shi | G01R 3/00 |
| RE46,958 E* | 7/2018 | Vinther | H02G 1/14 |
| 10,069,257 B1 | 9/2018 | Soubh et al. | |
| 10,181,687 B1 | 1/2019 | Peng et al. | |
| 10,998,660 B2* | 5/2021 | Chen | H01R 13/11 |
| 11,156,637 B2* | 10/2021 | Kister | G01R 1/06772 |
| 11,171,434 B2* | 11/2021 | Narumi | H01R 12/718 |
| 11,189,945 B2* | 11/2021 | Koshiishi | G01R 31/2886 |
| 2003/0006787 A1* | 1/2003 | Kazama | G01R 1/06716 324/755.05 |
| 2003/0082942 A1 | 5/2003 | Wlos | |
| 2010/0178798 A1 | 7/2010 | Rosenberger | |
| 2010/0267291 A1 | 10/2010 | Chabineau-Lovgren | |
| 2014/0322969 A1 | 10/2014 | Palinkas | |
| 2015/0180182 A1 | 6/2015 | Tatzel et al. | |
| 2015/0295359 A1 | 10/2015 | Vinther et al. | |
| 2016/0154024 A1 | 6/2016 | Miyagawa | |
| 2017/0142824 A1 | 5/2017 | Puzella et al. | |
| 2018/0131153 A1 | 5/2018 | Flaherty, IV | |
| 2018/0316103 A1 | 11/2018 | Flaherty, IV | |
| 2018/0366844 A1* | 12/2018 | Beganovic | H01R 24/50 |
| 2022/0131301 A1* | 4/2022 | Volkov | H01R 12/7082 |

\* cited by examiner

MULTIPORT CONNECTOR INTERFACE SYSTEM

TECHNICAL FIELD OF THE INVENTION

The present invention is directed to a connector interface with an electrical circuit board and specifically to a multiport RF connector to interface between electrical circuit boards and other RF signal handling components.

BACKGROUND OF THE INVENTION

Generally, the available electrical connection schemes between an electrical circuit board, such as a printed circuit board or PCB are somewhat limited due to the lack of a reliable connection. This may particularly be so with RF connectors and boards that require greater signal integrity. Usually, the connectors are individually soldered to the board and have to withstand certain rigorous environments. This can be a costly process, due both to the upfront design to ensure that the connector can withstand extreme environmental conditions and also due to the solder manufacturing and inspection process.

Another issue with current RF connector solutions on a PCB is the space availability and the necessary connector density for board connection. Individual connectors do not meet current demands for higher signal data transmission and greater density in RF connector packaging.

Current RF coaxial board mounted connectors require significant precision in the length tolerance of the various components, such as the body and center conductor, and insulator length in order to minimize tolerance variations. Otherwise, the tolerance variations may cumulatively stack up to be larger than the allowable gap at the interface between the center conductor of the connector and the PCB. This is particularly a problem for multiport connectors. A single connector with a single solder connection might be able to have solder fill any tolerance gap to secure the center conductor. That generally cannot be done with multiport connectors.

Solder free, field replaceable connectors might be used to address soldering drawbacks. But generally, the center conductors of field replaceable connectors present a higher contact pressure to the board. This may damage a fragile PCB signal trace. Over the life of the connector, the center conductor may also slide with respect to the signal trace and thereby lose contact pressure. This further results in a degraded RF performance.

Accordingly, there is currently a need for an RF connector interface for providing a cost effective and reliable RF signal connection between a PCB and other RF signal handling components.

SUMMARY OF THE INVENTION

A connector for interfacing with a circuit board includes a body having opposing first and second face surfaces and defining a plurality of ports extending between the face surfaces. A plurality of center conductors extend in respective ports between the face surfaces. Support elements engage the center conductors to secure the center conductors generally centered in the respective ports. Each center conductor includes a pin portion positioned proximate to the first face surface and a plunger portion positioned to extend beyond the second face surface. The plunger portion moves longitudinally with respect to the connector second face surface for varying the distance of an end of the center conductor from the second face surface to allow adjustability in the interfacing of the connector with a circuit board or other signal handling component.

DETAILED DESCRIPTION OF EMBODIMENTS OF THE INVENTION

Figure 1:
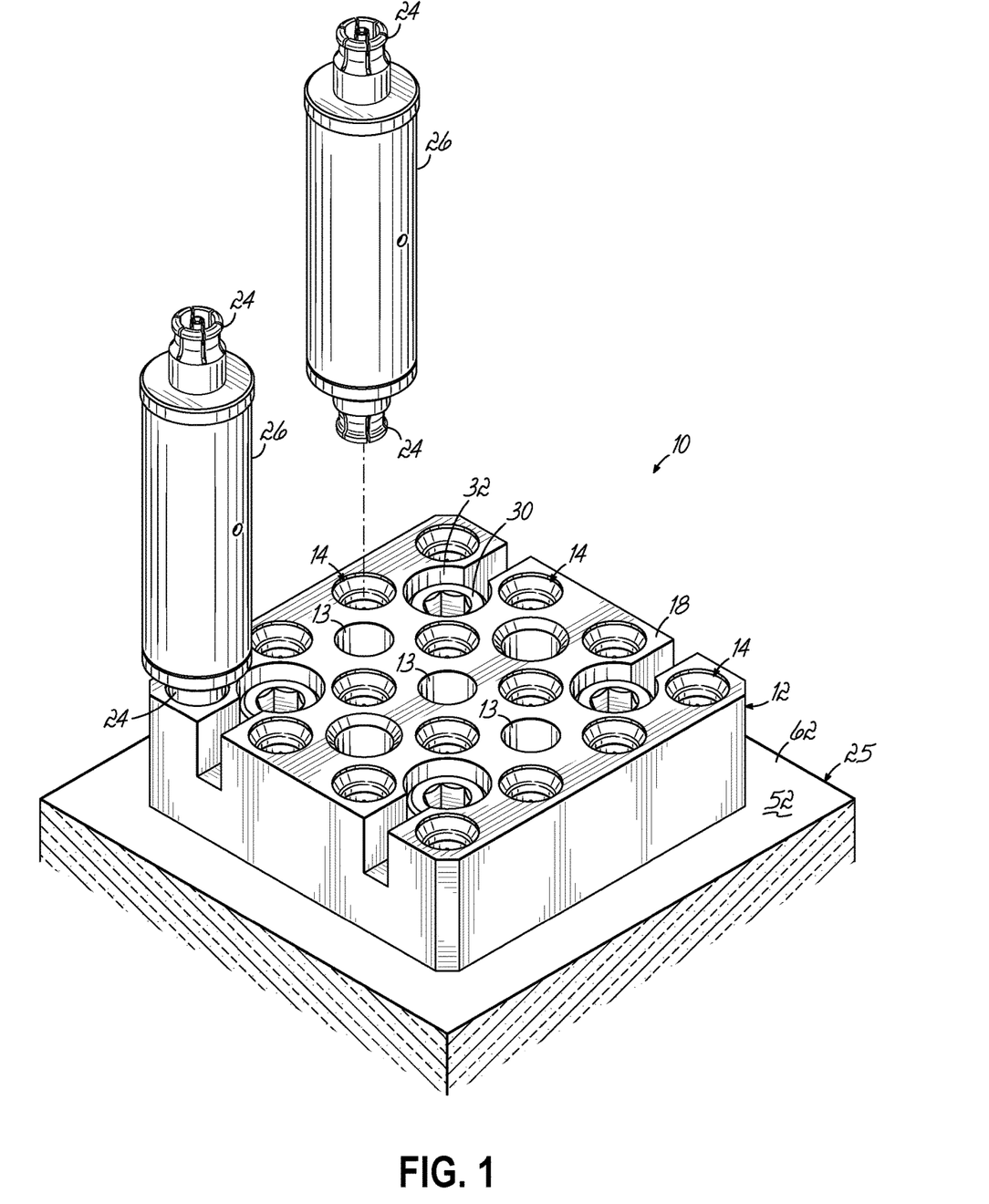
FIG. 1 is a perspective view of a multiport connector of an embodiment of the invention.
Figure 2:
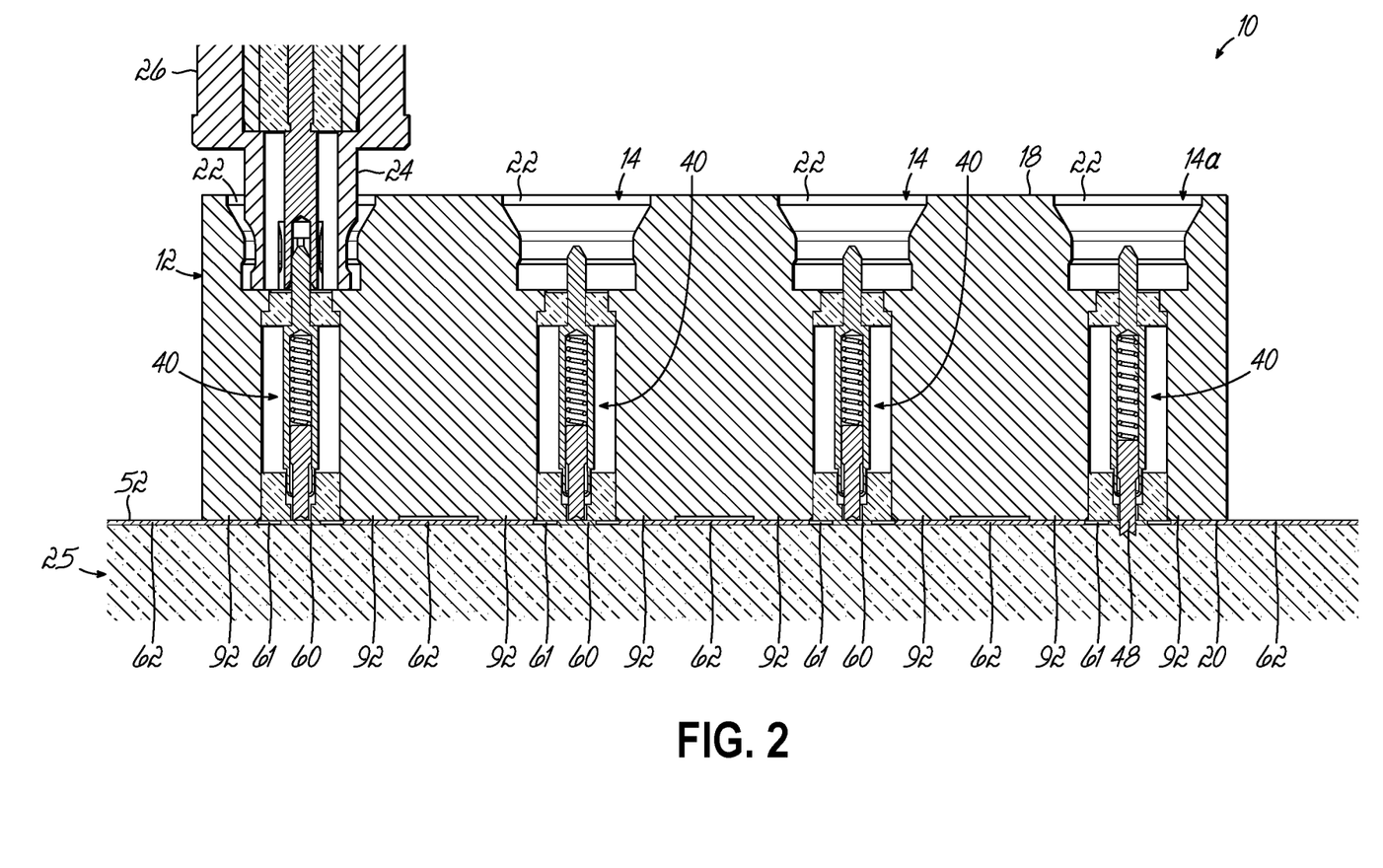
FIG. 2 is a cross sectional view of a multiport connector of the embodiment of the invention as illustrated in FIG. 1.

FIG. 1 illustrates a signal handling system including a multiport connector 10 in accordance with an embodiment of the present invention coupled with a printed circuit board (PCB) 25. The multiport connector 10 includes a connector body 12 that defines a plurality of ports 14 extending therethrough. The body is made of a suitable electrically conductive material, such as a brass alloy, and essentially has opposing first and second face surfaces 18, 20. The ports 14 provide an electrical signal path between the face surfaces 18, 20. The face surfaces interface with signal bearing elements or devices. For example, as shown in FIG. 2, one face surface 20 might be interfaced with printed circuit board 25, whereas the other face surface 18 may include a plurality of sockets 22 to receive appropriate connectors or portions of connectors. Port 14 terminates in a respective socket 22 (see FIG. 2). The socket 22 is configured for receiving an appropriate mating connector 24 as shown in FIGS. 1 and 2. The present invention has particular use as an RF connector to pass RF signals from a PCB 25 or connector 24, but the invention is not limited to just RF frequencies. The mating connector 24 can be coupled with a connector or adapter 26 as illustrated in FIGS. 1 and 2 or might be coupled with a cable (not shown) for directing signals between the PCB 25 and some other signal handling and/or processing components or devices through the connector 24.

Figure 5:
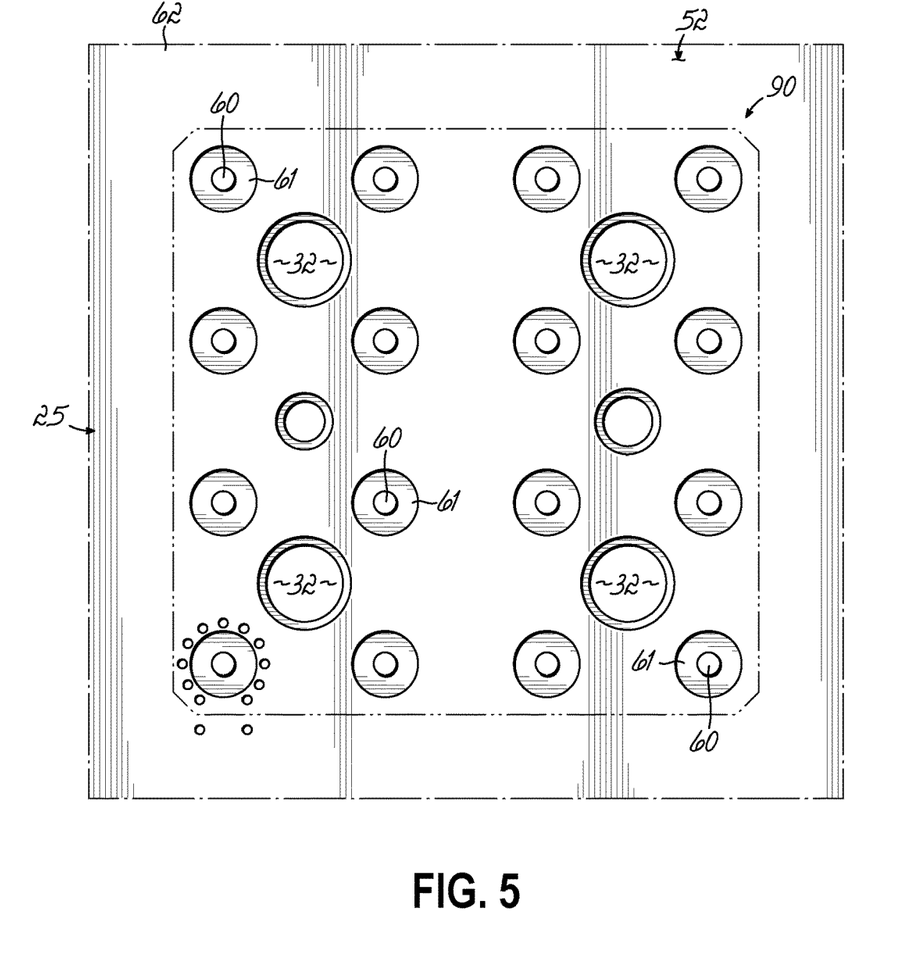
FIG. 5 is a plan view of a circuit board signal conducting pattern for a circuit board for use with a multiport connector of the embodiment of the invention as illustrated in FIG. 1.

As illustrated in FIGS. 1 and 5, the connector 10 may be coupled to a signal processing component, such as a printed circuit board (PCB), through the use of one or more fasteners 30 passing through appropriate holes or apertures 32 formed through the body 12 of the connector. The printed circuit board 25 may include aligned apertures (not shown) for mounting the connector thereto. Appropriate fasteners 30, such as screws or bolts may be used.

Figure 3:
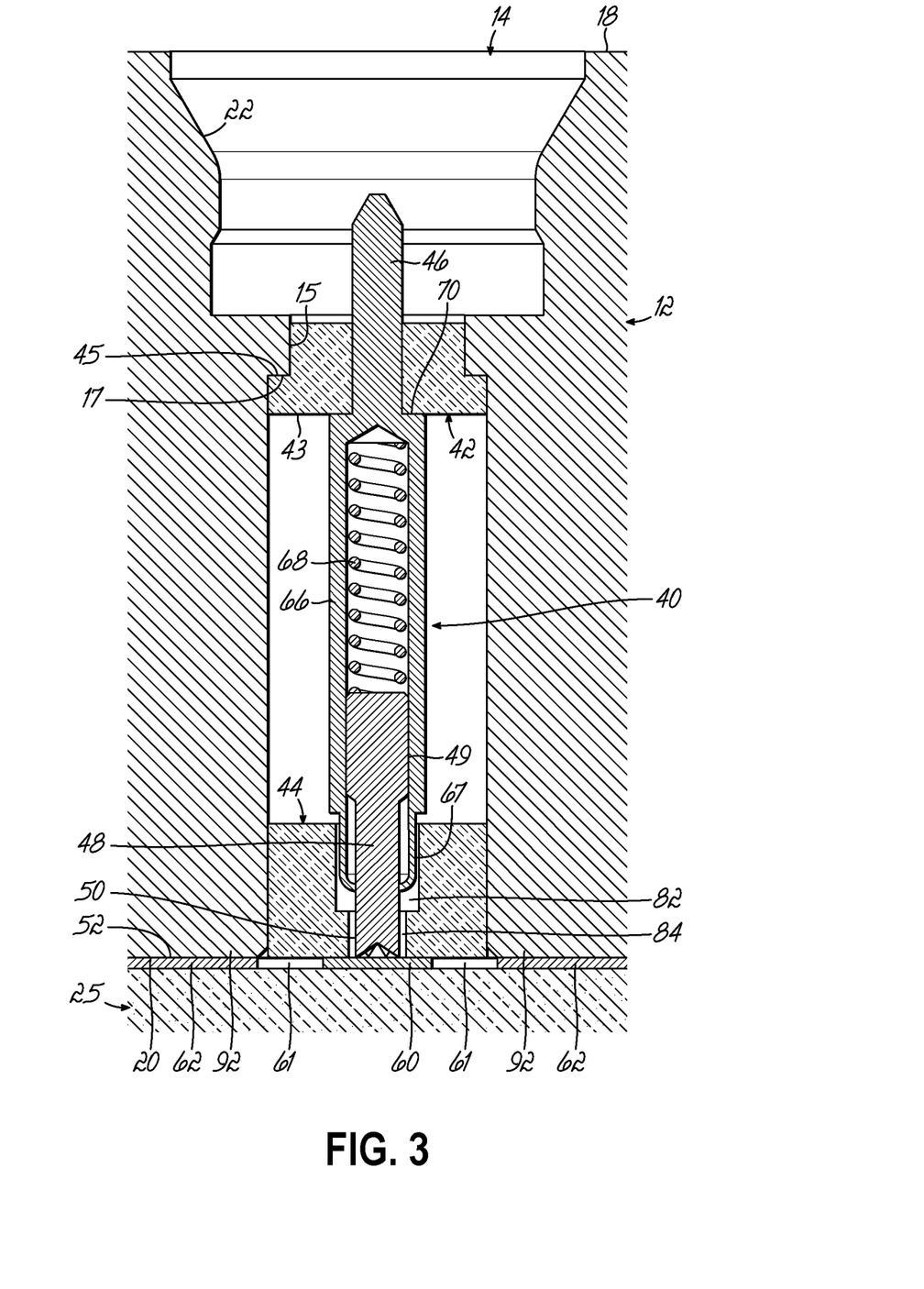
FIG. 3 is a cross sectional view of an exemplary port of a multiport connector of the embodiment of the invention as illustrated in FIG. 1.
Figure 4:
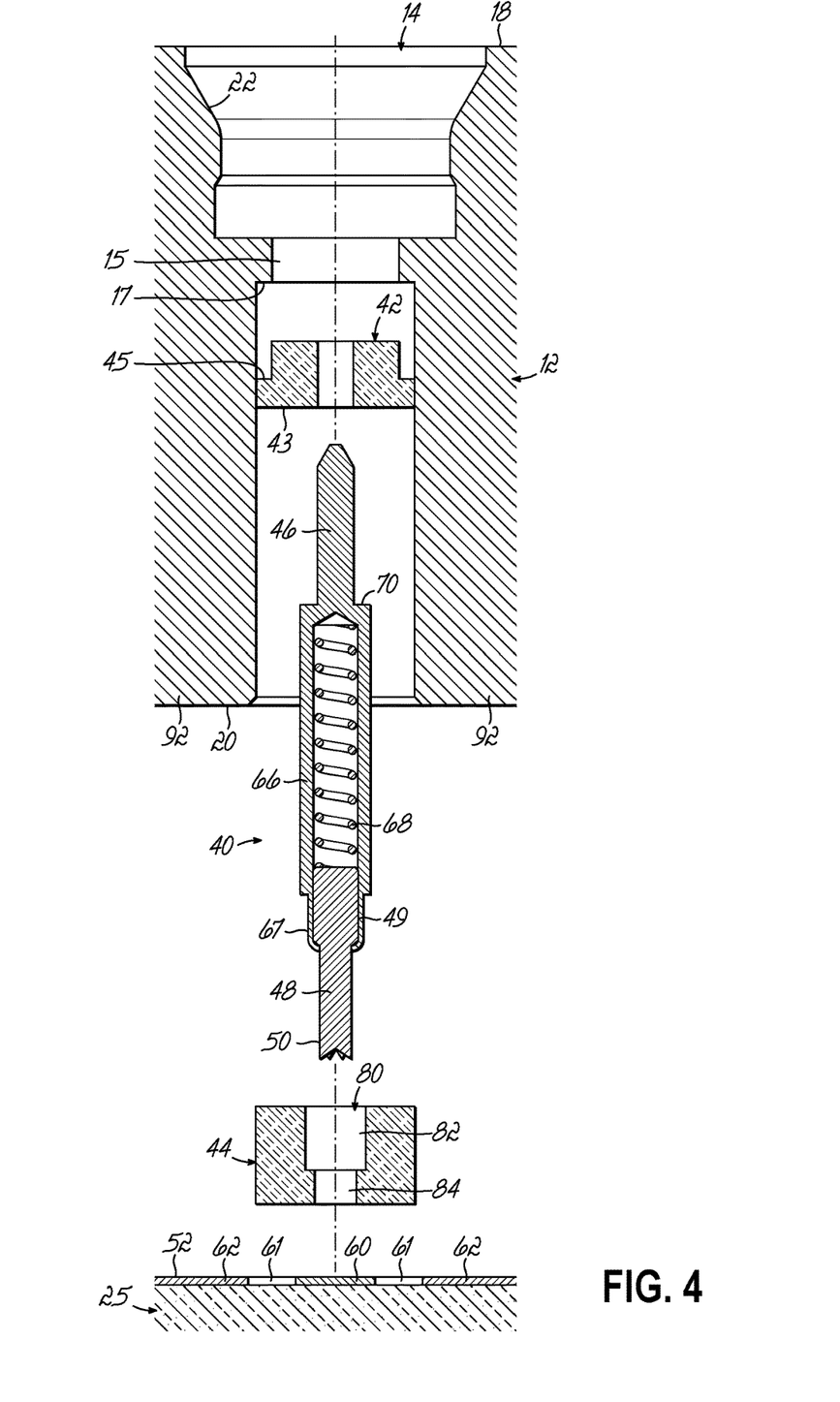
FIG. 4 is a cross sectional exploded view of an exemplary port of a multiport connector of the embodiment of the invention as illustrated in FIG. 1.

Referring to FIGS. 3 and 4, each connector port holds a center conductor 40 that extends generally in the port between the face surfaces 18, 20. The center conductor 40 is held in position in the respective port by one or more support structures 42, 44. The support structures 42, 44 engage the center conductor 40 and secure it generally centered in the port 14. As such, each of the sockets 22 present a generally coaxial connector socket to interface with a mating connector 24 as illustrated in FIGS. 1 and 2. In accordance with one aspect of the invention, the length of the center conductor 40 is variable to enable the connector 10 to be utilized in various different mounting arrangements wherein the tolerances may vary when coupling the connector 10 to a signal handling component, such as a printed circuit board 25. The connector 10 might be utilized in extreme environmental conditions, such as where there are large thermal variations and high vibrational forces and shocks. Relying upon a solder connection between the connector center conductors 40 and the signal handling component, such as a PCB requires precise positioning of the center conductors and soldering, whereas the current invention is more forgiving in such positioning.

One embodiment of the invention eliminates the solder connection to a printed circuit board which provides for the ability to have a multiport connector as illustrated that can be coupled with a signal handling component, such as a PCB and still have robust electrical connections without soldering to provide a reliable connection between the PCB and the connector 10 for the passage of RF signals. The present connector 10, in eliminating the requirement for a solder connection eliminates that costly process and also provides a connection that will not fail over extreme environmental conditions. Also, the connector 10 does not have to survive through a solder manufacturing process. The present invention provides a multiport connector 10 that may be configured to meet the demand for high signal data transmission and increased density packaging for certain markets, such as the aerospace market. The multiport connector 10 having a center conductor 40 of varying length presented at a face surface 20 of the connector provides a robust electrical connection despite varying gaps at the interface between the center conductor 40 and a printed circuit board 25 that may be encountered in various installations.

Referring to FIG. 3, the center conductor 40 includes a pin portion 46 which is positioned proximate to a face surface 18 and is presented in a socket 22 to present the coaxial connector arrangement at face surface 18. The center conductor 40 also includes a plunger portion 48 which is positioned to extend beyond of a face surface 20 of the connector body 12. The center conductor 40 is configured so the plunger portion 48 moves longitudinally with respect to the face surface 20 for varying the distance of an end or tip 50 of the center conductor from the face surface 20. The face surface 20 interfaces with a surface 52 of a PCB 25 that has various conductive traces including signal traces 60 and ground traces 62 for presenting RF signals or other electrical signals to the connector 10 to be passed therethrough, such as to another signal handling component through mating connector 24. As will be appreciated by a person of ordinary skill in the art, the PCB 25 may have a multi-layer construction with multiple internal conductive layers (not shown) and patterns that transmit the appropriate signals and ground potential around the board and to the traces 60, 62 and the connector 10 as appropriate.

In the embodiment illustrated in FIG. 3, the center conductor 40 includes the plunger portion 48 that moves longitudinally in the center conductor 40 within a tubular body 66. In the embodiment illustrated, a spring 68 biases the plunger portion 48 to move longitudinally within the tubular body 66. At an end of the center conductor 40, opposite the plunger portion 48, the tubular body 66 is coupled with pin portion 46 for forming the connector center conductor within the socket 22. To that end, the pin portion 46 of the center conductor 40 is generally fixed in position with respect to the socket 22 while the plunger portion 48 moves and extends the overall length of the center conductor 40 longitudinally in the port 14 to interface with a PCB 25. In the illustrated embodiment, the pin portion is integral with the tubular body 66. However, the pin portion 46 might be a separate element and might be otherwise physically and electrically coupled with the center conductor tubular body 66.

More specifically, as illustrated in FIG. 4, the center conductor tubular body 66 may include a shoulder 70 formed at one end, proximate to the pin portion 46. The pin portion 46 extends through an opening in support element 42 into the socket 22. The support element 42 is made of an electrically insulative material and is configured for engaging the pin portion 46 of the center conductor 40 to secure the center conductor generally centered in the port 14 and in the socket 22. The support element 42 is formed of an electrically insulative material, such as a suitable dielectric material like Polyetheretherketone (PEEK). To control the insertion depth of the pin portion 46, the shoulder 70 of the center conductor tubular body 66 abuts against a bottom surface 43 of the support element 42. Similarly, the support element 42 includes a shoulder 45 and the port 14 includes a narrow section 15 to provide a similar shoulder 17 which abuts against the shoulder 45 of the support element 42 to secure it in the port 14 and set the position of the pin portion 46 and its depth within the socket. (See FIG. 3.)

The plunger portion 48 moves longitudinally and within the tubular body 66 and includes a larger diameter section 49 that interfaces with a tapered section 67 of the tubular body 66 for containing the plunger portion section 49 in the tubular body and controlling the extension thereof. The biasing spring 68 extends in the body 66 between pin portion 46 and the plunger portion 48 within the tubular body 66 and biases the plunger portion 48 of the center conductor in the direction of face surface 20 of the connector body 12. To secure the center conductor 40 proximate to the face surface 20, another support element 44 is utilized and includes an aperture 80 therein for passage of the plunger portion 48 of the center conductor. Specifically, the aperture 80 includes a widened section 82 for receiving a section, such as tapered section 67, of the tubular body 66 of the center conductor and a narrowed section 84 for passage of the end of the plunger portion 48 to expose tip 50.

Figure 6:
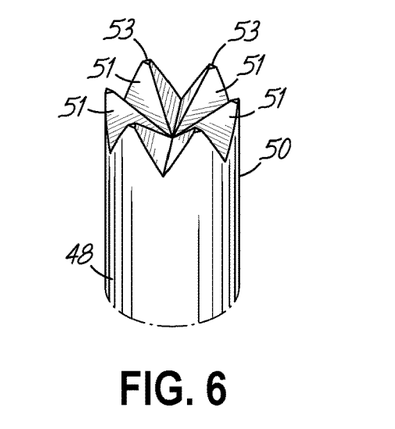
FIG. 6 is a perspective view of a tip of a center conductor element in accordance with a multiport connector of the embodiment of the invention as illustrated in FIG. 1.

In one embodiment of the invention, the tip 50 of the plunger portion 48 includes structure for digging into or more aggressively engaging the conductive signal trace 60 of the PCB 25. Referring to FIG. 6, a multipoint tip 50, such as a six point tip might be implemented having six prongs 51 with pointed ends 53 which aggressively engage the signal trace 60 on the PCB 25.

FIG. 3 illustrates an assembled connector 10 interfaced with a board 25 showing the plunger portion 48 and tip 50 engaging a signal trace. As shown in FIG. 2 in one of the ports 14a, the plunger portion 48 is illustrated extending past the face surface 20 of the connector and past signal trace 60 on PCB 25 to illustrate the variable length of the connector center conductor 40 in the invention. However, as will be readily understood by a person of ordinary skill in the art, when the connector 10 is interfacing to a printed circuit board 25, the plunger portion 48 will be driven upwardly into the connector 10 so that the tip 50 is generally flush with the signal trace 60 on a PCB 25 to provide proper electrical engagement. The spring 68 will bias the plunger portion 48 downwardly against the signal trace 60 and the longitudinal adjustability and movement of the tip 50 ensures that the connector 10 can provide a robust electrical connection at various spacings or tolerances between a face surface of the connector 10 and face surface 52 of a circuit board 25 or other surfaces having conductive traces 60, 62.

In one embodiment of the invention, the spring 68 might provide a bias force of approximately 20 g (mid stroke). In that way, the connector of the invention provides a robust electrical connection, without solder, allowing various tolerances and spacings between the connector 10 and the circuit board 25.

Referring again to FIG. 2, once the connector 10 is coupled to the circuit board 25 and secured thereto with appropriate fasteners 30, the connector 10 presents a multiport connector coupled to the appropriate signal traces 60 and ground traces 62 on the circuit board and provides various connector sockets 22 to interface with mating connectors 24 as shown in FIGS. 1 and 2. The invention increases the signal density on a printed circuit board and ensures a robust signal connection free from solder. Once the connector 10 is secured to a printed circuit board, the plunger portions 48 of the center conductor 40 robustly engage appropriate signal traces 60 and the connector body 12 engages appropriate ground traces 62 to provide a coaxial passage of RF signals in various signal handling components. Shocks and vibrations which may affect the interface at the connector and the circuit board 25 are less of a concern, as the center conductors 40 longitudinally adjust to ensure good electrical connection between the center conductors 40 and the signal traces 62. As may be appreciated, various connector configurations of the sockets 22 and the pin portions 46 and configurations of the mating connectors may be used to provide a connector with a number of different forms, such as SMP, SMPM, SMPS 1.85 mm, 2.4 mm, WMP and other connectors platforms.

Turning now to FIGS. 1 and 5, the connector 20 might include a plurality of alignment apertures 13 that are used to align the connector 10 on the appropriate signal traces of a circuit board 25. The alignment apertures might receive one or more alignment structures, such as support dowels located on the circuit board to provide proper alignment. Thereafter, the fasteners 30 may be fastened into apertures to secure the connector 10 with the circuit board. FIG. 5 illustrates one possible circuit board conductor pattern 90 to which connector 10 might interface. To that end, the pattern 90 includes signal traces or pads 60 corresponding to the various ports 14 and connector sockets 22 of the connector 10. The pads/traces 60 are surrounded by non-conductive areas 61 and then a ground signal trace or ground plane 62 to which the body 12 of the connector interfaces. Fastener apertures 32 to receive fasteners 30 are placed appropriately, such as toward corners of patterns 90, which is illustrated as a generally symmetrical square pattern. When connector 10 is affixed thereto the plunger portions 48 of the center connector 40 engage the signal traces 60, while the body 12 engages ground plane 62. To that end, referring to FIG. 2, the body 12, proximate each of the center conductors 40 and ports 14 may include a ground ring structure 92 surrounding each port and center conductor to ensure good electrical ground contact.

While the illustrated embodiment shows a 16 port connector, a person of ordinary skill in the art would understand that other connectors incorporating the invention may include a lesser or greater number of connection ports and sockets. As such, the number of ports of the connector is not limited to the illustrated embodiment.

While the present invention has been illustrated by a description of various embodiments and while these embodiments have been described in some detail, it is not the intention of the inventors to restrict or in any way limit the scope of the appended claims to such detail. Thus, additional advantages and modifications will readily appear to those of ordinary skill in the art. The various features of the invention may be used alone or in any combination depending on the needs and preferences of the user.

What is claimed is:

1. A connector for interfacing with a circuit board, the connector comprising:
a conductive body having opposing first and second face surfaces and defining a plurality of ports extending between the face surfaces;
the body including a plurality of sockets formed in the first face surface and interfacing with respective ports;
a plurality of center conductors, each center conductor extending in a respective port between the face surfaces;
at least one center conductor including a pin portion positioned proximate to the first face surface, the pin portion extending into a respective socket and mounted in a fixed relationship with respect to the respective socket and first face surface;
the at least one center conductor including a plunger portion configured to move with respect to the pin portion to vary the length of the center conductor at the second face surface;
the plunger portion being biased for moving longitudinally for varying the distance of an end of the center conductor with respect to the second face surface.

2. The connector of claim 1 wherein the plunger portion and pin portion of the at least one center conductor are coupled together with a spring for biasing the plunger portion away from the pin portion to vary the length of the center conductor.

3. The connector of claim 1 wherein each socket terminates in the first face surface of the connector body.

4. The connector of claim 1 further comprising a support element made of electrically insulative material and configured for engaging a respective center conductor to secure the center conductor generally centered in the respective port.

5. The connector of claim 1 further comprising a plurality of support elements configured for engaging the at least one center conductor, with at least one support element positioned to secure the pin portion in the port and another support element positioned to secure the plunger portion in the port.

6. The connector of claim 5 wherein the at least one support element positioned to secure the pin portion fixes the pin portion in the respective socket.

7. The connector of claim 1 wherein at least one of the sockets is configured for providing a socket for at least one of an SMP, SMPM, SMPS, 1.85 mm, 2.4 mm, or WMP connector.

8. A signal handling system comprising:
a circuit board having a conductive pattern on a surface thereof, the conductive pattern including a signal trace and a ground trace;
a connector for interfacing with the conductive pattern on the circuit board, the connector comprising:
a conductive body having opposing first and second face surfaces and defining a plurality of ports extending between the face surfaces, the second face surface coupling with the surface of the circuit board;
the body including a plurality of sockets formed in the first face surface and interfacing with respective ports;
a plurality of center conductors, each center conductor extending in a respective port between the face surfaces;

at least one center conductor including a pin portion positioned proximate to the first face surface, the pin portion extending into a respective socket and mounted in a fixed relationship with respect to the respective socket and first face surface;

the at least one center conductor including a plunger configured to move with respect to the pin portion to vary the length of the center conductor at the second face surface with respect to a conductive pattern on the circuit board;

the plunger portion being biased for moving longitudinally to contact the signal trace on the circuit board.

9. The signal handling system of claim 8 wherein the plunger portion and pin portion of the at least one center conductor are coupled together with a spring for biasing the plunger portion against the signal trace on the circuit board.

10. The signal handling system of claim 8 wherein each socket terminates in the first face surface of the connector body.

11. The signal handling system of claim 8 further comprising a support element made of electrically insulative material and configured for engaging a respective center conductor to secure the center conductor generally centered in the respective port.

12. The signal handling system of claim 8 further comprising a plurality of support elements configured for engaging the at least one center conductor, with at least one support element positioned to secure the pin portion in the port and another support element positioned to secure the plunger portion in the port.

13. The signal handling system of claim 12 wherein the at least one support element positioned to secure the pin portion fixes the pin portion in the respective socket.

14. The signal handling system of claim 8 wherein at least one of the sockets is configured for providing a socket for at least one of an SMP, SMPM, SMPS, 1.85 mm, 2.4 mm, or WMP connector.

* * * * *